United States Patent [19]

McCowen et al.

[11] Patent Number: 4,910,795
[45] Date of Patent: Mar. 20, 1990

[54] WIRELESS HAND HELD MICROPHONE

[76] Inventors: Clinton R. McCowen, 505 23rd St., Niceville, Fla. 32578; Gerald G. Doiron, 285 Echo Cir., Fort Walton Beach, Fla. 32548

[21] Appl. No.: 61,141

[22] Filed: Jun. 11, 1987

[51] Int. Cl.$^4$ .................. H04B 1/034; H04B 1/03; H04B 11/03
[52] U.S. Cl. .................. 455/95; 455/128; 455/129; 381/168
[58] Field of Search .................. 455/95, 89, 90, 100, 455/128, 129, 127; 381/122, 168

[56] References Cited

U.S. PATENT DOCUMENTS

| 2,840,694 | 6/1958 | Morgan | 455/95 |
| 3,134,075 | 5/1964 | Langevin | 455/128 X |
| 3,408,571 | 10/1968 | Wilson | 455/95 X |
| 3,564,416 | 2/1971 | Price | 455/95 |
| 3,718,862 | 2/1973 | Norris | 455/95 |
| 4,344,184 | 8/1982 | Edwards | 455/95 |

FOREIGN PATENT DOCUMENTS

| 2390049 | 1/1979 | France | 455/128 |
| 2461431 | 3/1981 | France | 455/95 |

OTHER PUBLICATIONS

Allied Electronics, 1980 *Engineering Manual & Purchasing Guide* No. 800, 8/27/79, p. 230.
"'Vagabond' Wireless Microphone System", Thomas W. Phinney, Tele-Tech & Electronic Industries, 3/54, pp. 86–88 and 152–157.

*Primary Examiner*—Robert L. Griffin
*Assistant Examiner*—Ralph E. Smith
*Attorney, Agent, or Firm*—Needle & Rosenberg

[57] ABSTRACT

A microphone is provided in which two circuit boards are held in spaced parallel position by each being connected at one end to a supporting member and by each resting at the other end in a pair of stabilizing grooves located within the microphone head. A battery holding assembly has attached at one end the supporting member, and at the other end an antenna mounting surface onto which a coiled antenna is placed. A battery holding compartment is located between the supporting member and the antenna so that a battery held in the compartment acts as an addition to the antenna itself. A power and battery level indicator flashes on and off to warn that the charge of the battery is reaching a predetermined low point. The electronic circuitry for the indicator is also provided.

12 Claims, 2 Drawing Sheets

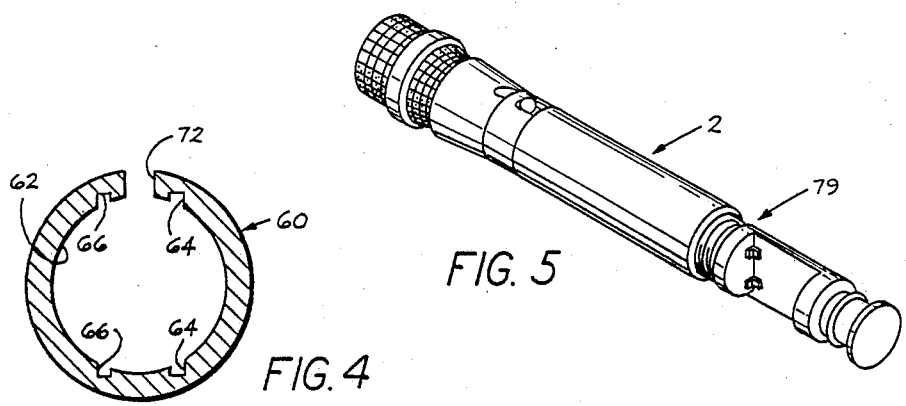
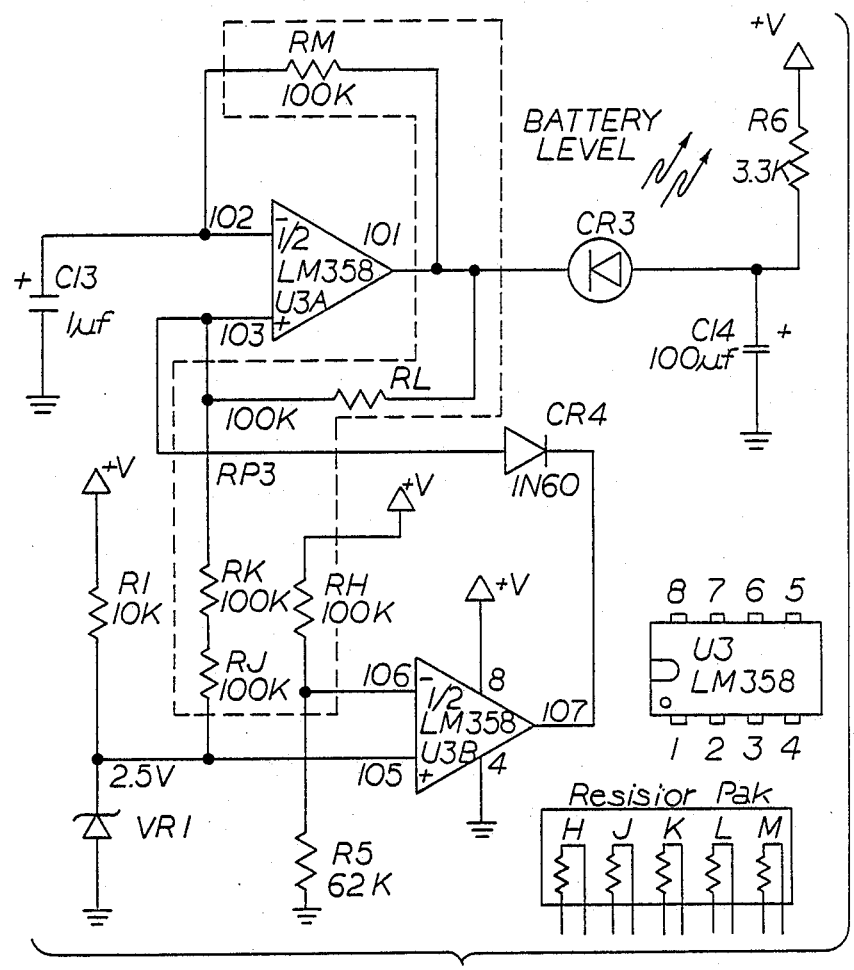

WIRELESS HAND HELD MICROPHONE

The present invention relates to microphones, and more particularly, to wireless hand held microphones.

BACKGROUND OF THE INVENTION

Recently, wireless, hand held microphones have become very popular with entertainers, lecturers, and others seeking sound amplification. Wireless microphones provide freedom of movement by eliminating the audio cable which has traditionally been used with hand held microphones. This results in enhancing the performance visually and minimizing staging problems.

A wireless microphone typically operates as a radio transmitter which delivers VHF signals to a receiver. Power is supplied by a battery, typically 9 volt. The internal components, including those relating to audio and radio frequency, are placed on a single circuit board which is located within the microphone housing.

Several disadvantages arise in the use of hand held microphones. These are primarily due to the fact that such devices are often dropped, bumped or otherwise abused, and also because the need to maintain the microphone at a relatively short length has heretofore been met by using the smallest components are available on a single circuit board. Such small components are costly, difficult to assemble and are often very difficult, if not impossible, to repair. Also, if the components relating to one of either audio or radio frequency cannot be repaired and must be replaced, the entire circuit board must be discarded. This results in unnecessary cost to the owner, waste of components and increased periods of time during which the microphone is unusable.

Another disadvantage of wireless microphones is that quite often the electrical current running through the circuit board interferes with transmission of the radio signals through the antenna. This is, in part, a result of a desire to place the antenna within the microphone housing for aesthetic purposes. This results in static or buzzing, and otherwise adversely affects sound quality.

Therefore, it is clear that there exists a need for a hand held wireless microphone of desired small size which is sturdy, which minimizes breakage of internal components when it is inevitably dropped, which eliminates the need to replace both the audio frequency components and radio frequency components when only one such set of components is irreparable, and which can be made using cheap, more easily fixed, standard size components.

There also exists a need for a wireless microphone which eliminates the problem of interference to radio signals caused by the effect of an internal antenna on a circuit board. There also exists a need for a wireless microphone that has a replaceable battery cover that does not detract from the aesthetic appearance of the microphone from any visual angle.

SUMMARY OF THE PRESENT INVENTION

The present invention provides a wireless, hand held microphone which is of such construction that it eliminates the above-referenced problems.

The microphone comprises an internal assembly, a microphone head, and a component housing. The internal assembly is comprised of, in series, a pair of parallel, spaced apart circuit boards, a frame, and an antenna. The internal assembly is received within the component housing, and the microphone head is threadingly attached to the housing.

The pair of circuit boards are maintained in stable position by being attached at their lower ends to the respective parallel surfaces of a supporting member, which extends longitudinally from the frame. Additionally, the microphone head has two internal sets of longitudinally extending stabilizing grooves which allow the upper ends of the circuit boards to be fitted securely therein. Located between the two circuit boards, and providing additional stability, is a mute switch combination, which is comprised of a box-like switch and a handle which laterally extends outside the housing so as to be accessible to the operator. The head, to accommodate the switch assembly, has a switch groove through which the handle slides when the circuit boards are fitted within the head. Once the boards are secured within the head, the component housing is brought over the internal assembly and threadingly attached to the head, thereby holding the internal assembly in a stable configuration.

As a result of this construction, the radio frequency components may be placed on the first circuit board, and the audio frequency components on the second. This allows one board, and therefore one set of components, to be replaced without requiring replacement of the other. Also, this allows interchangeability of different frequency boards or audio boards so that customized microphones can be more easily produced. Additionally, during manufacturing, the boards can be separately yet simultaneously tested, which is quicker, more economical and more accurate than testing a single board having both frequencies.

Another important aspect of the present invention relates to the positioning of the frame and the antenna. The antenna is affixed to an antenna mounting surface appearing on the lower portion of the frame. During use, the antenna is separated from the circuit boards by a battery placed within a battery holding compartment located on the frame between the boards and the antenna mounting surface. This acts to insulate the antenna from the effects of the circuit boards, and therefore inhibits interference, thus providing better sound quality. Also, the battery acts as an addition to the antenna, thereby further enhancing the antenna's efficiency resulting in better sound quality over longer distances of space.

Still another important aspect of the present invention relates to a power and battery level which is located on the housing and which is illuminated when the battery is at or near full power, and which flashes to indicate that the battery charge is low. This serves to warn the user of the need to change the battery, and avoids embarrassment during presentations.

It is an object of this invention, therefore, to provide a hand held microphone which has a relatively short length but which utilizes standard sized commonly available components.

It is also an object of this invention to provide such a microphone which is sturdy so as to minimize the breakage of components commonly associated with hand held microphones.

It is another object of this invention to provide a microphone which eliminates the need to replace both the audio frequency components and the radio frequency components when only one set of such components is irreparable.

It is a further object of this invention to provide interchangeability of audio frequency and radio frequency components so that microphones having customized frequencies can be more efficiently produced.

It is yet a further object of this invention to provide a microphone in which testing of the radio frequency components and audio frequency components can be carried out separately yet simultaneously.

It is a still further object of this invention to reduce the adverse effects to sound quality caused by the effect of the antenna on the circuit boards.

It is a still further object of this invention to allow interchangeability of the microphone ball and element to various manufacturers and styles.

It is yet another object of this invention to enhance sound quality by positioning the antenna on the battery holding assembly so that the battery acts as an addition to the antenna.

It is yet a still further object of this invention to provide a power and battery level indicator that is illuminated and facing the user as to be easily seen at all time when the transmitter is turned on and which actively attracts the user's attention by flashing on and off when the battery is low.

BRIEF DESCRIPTION OF FIGURES OF THE DRAWING

FIG. 4 shows a cross-sectional view of the head portion of the microphone taken along line 4-4 in FIG. 1

FIG. 5 shows a perspective view of the microphone of the present invention having only its battery holding compartment exposed.

FIG. 6 is a diagram of the circuitry for the power and battery level indicator of the microphone of the present invention.

DETAILED DESCRIPTION OF THE INVENTION

Figures 1, 2, 3:
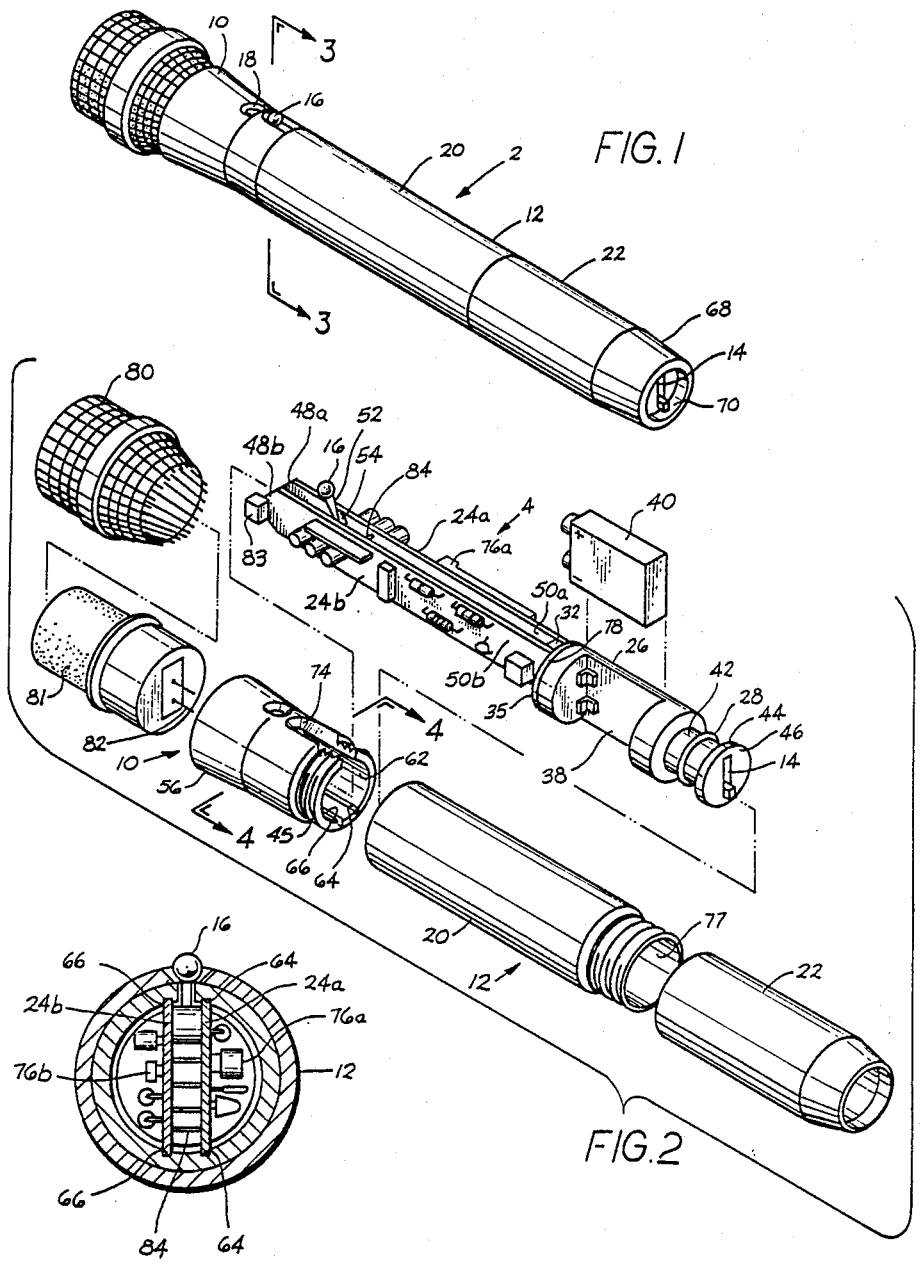
FIG. 1 shows a perspective view of the microphone of the present invention.
FIG. 2 shows an exploded perspective view of the present invention.
FIG. 3 shows a cross-sectional view of an assembled microphone of the present invention taken along line 3-3 in FIG. 1.

FIG. 1 shows the assembled microphone 2 of the present invention. The microphone 2 has, as its major external elements, a head 10 and a protective component housing 12. The component housing 12, in turn, is elongated and tubular in shape and comprises an upper housing 20, and a lower housing 22 threadingly attachable to the upper housing 20. FIG. 2 illustrates the internal assembly 4 of a wireless, hand held microphone 2 of the present invention, which comprises, in series, of a pair of parallel spaced circuit boards 24a, b having the requisite circuitry for such a microphone, a frame 26, and an antenna 28. The upper housing 20 is such that it covers the internal assembly 4, and the lower housing 22 is such that it covers the battery compartment 38, discussed below, of the frame 26. The battery compartment 38 can therefore be accessed by separating the lower housing 22 from the upper housing 20. For aesthetic purposes, the connection between the housings 20 and 22 should be as invisible as possible. It is preferable that the lower housing 22 be made of non-conductive plastic.

The frame 26, having a tubular body portion, is generally circular in overall shape and acts as a supporting structure for both the circuit boards 24a, b and the antenna 28. A rectangular-shaped supporting member 32 extends longitudinally from the front surface 35 of the frame 26. The width of the supporting member 32 corresponds to the distance between the circuit boards 24a, b. A battery holding compartment 38, which holds a conventional 9-volt battery 40 that powers the microphone 2 through standard circuitry (not shown) connected to boards 24a, b and switch 14, is located midway along the frame 26.

Located near and extending longitudinally from the rear of the frame 26 is an antenna mounting surface 42 upon which the antenna 28 is coiled. The surface 42 is cylindrical in shape so that the antenna 28 can be coiled around in a relatively small area. A circular flange 44 is located at the rear of the frame 26 and acts to hold the antenna 28 onto the mounting surface 40. The frame 26 terminates in a flat, rear circular surface 46. A radio transmission on-off switch 14 is on the rear surface 46; and an illuminating, user visible power and battery level indicator for indicating when the microphone is on or off, is located on the head 10. As an option, the indicator 18 may be such that it indicates, by flashing, that the battery is running out of power.

The circuit boards 24a, b each have a front end 48a, b and a back end 50a, b with the back ends 50a, b being secured through conventional means to the respective opposite faces of the supporting member 32 to hold the back ends 50a, b of the boards 24a, b in relatively stable, parallel position. Additionally, a mute switch assembly 52 for turning the microphone audio on and off while maintaining a radio frequency link with the receiver is provided between and connected to the circuit boards 24a, b adjacent the front ends 48a, b. The assembly 52 comprises a box-like switch 54 with a switching handle 16 laterally extending therefrom. The mute switch assembly 52 can be used as a means of further maintaining the boards 24a, b in the relatively stable parallel position. Also, a five pin and socket connector 84 is provided for further maintaining the boards 24a, b in stable position.

As shown in FIGS. 1 and 2, a microphone head portion 10 is provided having a standard microphone cartridge 81 which is modified by adding a plug 82, which connects with a socket 83 located on the internal assembly 4. This permits cartridges 81 to be easily interchanged and eliminates the wire connections typically found between the cartridge 81 and the circuitry. A standard type, interchangeable microphone ball 80 is also provided. An annular skirt 56 depends from the housing 12 and has threads 45 which are threadingly engagable with complimentary threads in the top of the housing 12. Referring to FIG. 4, the skirt 56 of the head 10 has an outer surface 60 and an inner surface 62. Located on the inner surface 62 are two pairs of parallel first and second stabilizing grooves, 64, 66 which receive therein the circuit boards 24a, b respectively. The distance between the grooves 64, 66 is equivalent to the thickness of the supporting member 32. In this manner, the circuit boards 24a, b can be maintained in stable parallel position relative to each other when the head 10 is attached to the internal assembly 4, as seen in FIG. 3. Also, the five pin and socket connector 84 is used to provide electrical connections between the boards 24a, b.

The length of the internal assembly 4 is such that the housing 12 covers only a portion of the assembly 4, and the front ends 48a, b extend beyond the housing 12 to allow easy insertion of the front ends 48a, b into the head 10. The rear of the upper housing 20 has a circular flange 77 which abuts a locking ridge surface 78 of the frame 26 when the upper housing 20 is placed over the internal assembly 4 and threaded to the head 10. This acts to apply force equally on both boards 24a, b forward from the flange 77 of the upper component housing 20 towards the head 10, and thereby maintains the position of the circuit boards 24a, b within the stabilizing grooves, 64, 66. To prevent the assembly from rotating and thereby applying pressure on the boards 24a, b, a set screw 79, shown in FIG. 5, is threaded into the frame 26 and notched on flange 77.

To allow the handle 16 of the switch assembly 52 to be accessable, an open ended slot 72 is located along the skirt 56 of the head 10. When the circuit boards 24a, b are placed into the head 10, the handle 16 fits into and slides through the slot 72. When the handle 16 is at the end 74 of the slot 72, the component housing 12 can be threaddedly attached to the head 10 so that the housing 12 covers the major portion of the slot 72, as shown in FIGS. 1 and 5.

The power and battery level indicator 18 is located on the housing 12 adjacent the mute switch handle 16. This provides easy visability to the user, who must be constantly be aware of the amount of power remaining in the microphone battery 40. The indicator 18 of the present invention is designed to further aid the user in making this determination by flashing at a predetermined low battery voltage point. When the battery 40 is at a relatively high power, the indicator 18 remains lit.

The circuitry relating to the indicator 18 is shown in FIG. 6. A resister R1 and voltage reference VR1 form a 2.5 volt reference that is maintained when the battery voltage is at a maximum (typically 9V) and when the battery voltage is reduced to 4 volts or less.

The 2.5 volt reference is connected to the non-inverting (+) input of amplifier/comparator U3B. The inverting negative input is connected to voltage dividers RH and R5. When the battery voltage decreases to a predetermined point, i.e. 6.5 volts, the voltage divider applies slightly less than 2.5 volts to a U3 pin 106. The output of U3 pin 107 then switches from a low to a high level. When this occurs, diode CR4 is reverse biased and U3 pin 103 is allowed to swing positive. When this occurs the oscillator of U3A will start to flash the indicator diode CR2 "on" and "off".

U3A forms a soft oscillator circuit. When diode CR4 allows pin 103 to go positive, U3A pin 101 switches to a positive voltage. Capacitor C13 now charges slowly positive through resistor RM until the voltage at the negative input of comparator/amplifier U3A exceeds the voltage at the positive input. U3A pin 101 output then goes towards ground, thereby slightly lowering the voltage on U3A pin 103 by resistor RL. Pin 101 now being low causes C13 to discharge through RM. When the voltage at U3A pin 102 goes below the voltage at U3A pin 103, pin 101 goes high and the cycle is repeated.

When the indicator 18 flashes, brightness is accomplished when U3A pin 101 switches low to forward bias light emmitting diode CR3, and the positive charge stored by capacitor C14 is discharged through CR3 causing a momentary bright flash that can be easily perceived. Resistor R16 then recharges C14 for the next flash.

The circuit is designed to work over a range of 4 volts to 24 volts or higher. The typical voltages described are for a 9 volt battery application. The LM 358 circuit element is a functional operational amplifier block. Of course, other operational amps will also work in this circuit. Typical circuit measurements are as follows:

| Battery Voltage | Current (milliAmps) | Light State |
| --- | --- | --- |
| 9 V | 3 ma | Solid On |
| 6.23 V | 1.95 ma | Solid On |
| 6.21 V | 1.9 ma | Flashing |
| 3.75 V | .88 ma | Flashing |
| 3.68 V | .62 ma | Off |

The above described circuitry is designed to run on low current so as to reduce battery 40 consumption, and to take advantage of a low component count. Also, slow switching is provided between the on and off states to reduce radio frequency interference being introduced into nearby or associated transmitters.

There are several advantages afforded by the unique construction of the microphone 2 described above. First, the use of parallel circuit boards 24a, b results in increased space for circuitry components 76a, b. Such increased space allows the use of standard, easy to repair components 76a, b, and still permits the microphone 2 to be of a desired, relatively short length. The boards 24a, b also act as spacers to hold the frame 26 firmly inside the housing 12 against locking ridge 78. A rear circular flame 70 on lower housing 22 abuts the rear surface 46 of the frame 26 and further provided stability. Additionally, the use of more than one board 24a, b provides the ability to segregate components 76a, b according to their function on the different boards 24a, b. For example, one set of components 76a may be specific for audio functions, and a second set of components 76b may be specific for radio frequency functions. As such, if a component related to one such function breaks and cannot be repaired, only its board 24a, b must be replaced, and not the whole circuitry. Also, preassembly testing of the individual circuit boards 24a, b can be performed independently and is therefore quicker and less costly.

Another advantage of the present microphone is the added stability provided to the internal assembly 4 as a result of the boards 24a, b resting in the stabilizing grooves 64, 66 at one end and held onto the supporting member 32 at the other. This construction minimizes damage to the internal assembly 4 by providing a cushioning effect to the circuitry components 76a, b when the microphone 2 is inevitably dropped.

A third advantage of the present microphone 2 is that the separation of the antenna 28 from the circuit boards 24a, b by means of the battery 40 results in better sound quality. The location of the battery 40 in relation t the antenna 28 causes the battery 40 to act as an addition to the antenna 28, thereby resulting in better transmission and reception of radio signals.

What is claimed is:
1. A hand held, battery powered microphone comprising:
 (a) an internal assembly comprising:
  (i) a frame having a front surface and a rear surface, said frame comprising:
   (a) a supporting member extending longitudinally from said front surface of said frame;
   (b) an antenna mounting surface adjacent said rear surface; and

(c) a battery holding compartment located between said supporting member and said antenna mounting surface for receiving therein a battery;

(ii) a pair of spaced parallel circuit boards having requisite microphone circuitry thereon and each having a front end and a back end with said boards being secured to said supporting member about said respective back ends; and (b) a microphone head having means for stabilizing said circuit board front ends in spaced parallel relationship to each other; and (c) a housing of a length to receive therein said internal assembly and including means to detachably secure said microphone head to said housing.

2. The battery powered microphone of claim 1, wherein said microphone head has an annular skirt depending therefrom, said skirt having an inner surface and an outer surface, and said stabilizing means is comprised of two pairs of spaced, parallel grooves extending longitudinally along said inner surface, each pair of grooves in registry to receive therein a portion of one of said pair of circuit boards.

3. The battery powered microphone of claim 1, and further comprising a mute switch assembly having a switch secured between and adjacent said front ends of said circuit boards to further maintain said circuit boards in spaced parallel relationship to each other, and a handle extending longitudinally from said switch beyond said housing, and wherein said microphone head has a mute switch handle slot through which said handle slides when said internal assembly is maintained within said head.

4. The battery powered microphone of claim 1, and further comprising a pin and socket connector located between said front ends of said parallel circuit boards for further stabilizing said boards.

5. The battery powered microphone of claim 1, wherein said antenna mounting surface is cylindrical, and said antenna is coiled around said surface.

6. The battery powered microphone of claim 1, wherein requisite circuitry is comprised of standard sized components.

7. The battery powered microphone of claim 1, wherein one of said circuit boards contains radio frequency components and the other circuit board contains audio components.

8. The battery powered microphone of claim 1, and further comprising a user visible power and battery level indicator 18 which indicates that said battery is producing a low amount of power.

9. The battery powered microphone of claim 8, wherein said power and battery level indicator is a light which flashes on and off to indicated said battery is producing a low amount of power.

10. The battery powered microphone of claim 1, wherein said housing is comprised of an upper component housing for covering said circuit boards and said front surface of said frame, and a lower component housing for covering said battery holding compartment, said upper housing threadably connectable to said lower component housing.

11. The battery powered microphone of claim 1, wherein said frame further comprises a circular locking ridge surface located on said front face of said frame, and said housing comprises a circular flange located within said housing capable of abutting said locking ridge surface when said housing is placed over said internal assembly to hold said internal assembly stable within said housing.

12. A frame for holding internal components of a battery powered microphone having a pair of parallel circuit boards and a coiled antenna, comprising:

(a) a tubular body portion having a front surface and an opposed rear surface;

(b) an antenna mounting surface on said body portion adjacent said rear surface on said frame for holding said coiled antenna;

(c) a supporting member extending longitudinally from said front surface capable of having said pair of parallel circuit boards mounted thereon;

(d) a battery holding compartment on said body portion between said supporting member and said antenna mounting surface for receiving therein a battery; and (e) a circular flange located on said front face of said frame for holding said frame stable within a housing.

* * * * *